United States Patent
Watson et al.

(10) Patent No.: US 8,937,289 B2
(45) Date of Patent: Jan. 20, 2015

(54) HIGH HEAT LOAD OPTICS WITH VIBRATION ISOLATED HOSES IN AN EXTREME ULTRAVIOLET LITHOGRAPHY SYSTEM

(71) Applicant: Nikon, Tokyo (JP)

(72) Inventors: Douglas C. Watson, Campbell, CA (US); Travis Bow, East Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/833,565

(22) Filed: Mar. 15, 2013

(65) Prior Publication Data
US 2013/0323649 A1 Dec. 5, 2013

Related U.S. Application Data

(60) Provisional application No. 61/652,789, filed on May 29, 2012.

(51) Int. Cl.
*G21K 5/04* (2006.01)
*G03F 7/20* (2006.01)

(52) U.S. Cl.
CPC .......... *G03F 7/2008* (2013.01); *G03F 7/70875* (2013.01); *G03F 7/709* (2013.01)
USPC .................. 250/504 R; 250/492.1; 250/492.2

(58) Field of Classification Search
USPC ................. 250/492.1, 492.2, 492.21, 492.22, 250/493.1, 504 R
See application file for complete search history.

(56) References Cited

U.S. PATENT DOCUMENTS

| | | | | |
|---|---|---|---|---|
| 6,036,162 | A * | 3/2000 | Hayashi | 248/550 |
| 6,396,562 | B1 | 5/2002 | Iwanaga | |
| 2005/0099611 | A1 * | 5/2005 | Sogard | 355/30 |
| 2010/0195074 | A1 * | 8/2010 | Sogard | 355/67 |

FOREIGN PATENT DOCUMENTS

JP 2000-173884 6/2000

\* cited by examiner

*Primary Examiner* — Nicole Ippolito

(57) ABSTRACT

Methods and apparatus for reducing vibrations in an extreme ultraviolet (EUV) lithography system associated with the cooling of mirrors are described. According to one aspect of the present invention, an apparatus includes a first assembly, a structure, a vibration isolator, and a hose arrangement. The first assembly includes a heat exchanger and a mirror assembly. The structure is subject to vibrations, and the vibration isolator is arranged to attenuate the vibrations when the vibrations are transmitted through the hose arrangement. The hose arrangement being coupled between the heat exchanger and the structure, and the vibration isolator is coupled to the hose arrangement.

25 Claims, 12 Drawing Sheets

HIGH HEAT LOAD OPTICS WITH VIBRATION ISOLATED HOSES IN AN EXTREME ULTRAVIOLET LITHOGRAPHY SYSTEM

CROSS-REFERENCE TO RELATED APPLICATION

The present applications claim benefit under 35 U.S.C. §119(e) of U.S. Provisional Patent Application No. 61/652,789, entitled "High Heat Load Optics with Vibration Isolated Hoses in an Extreme Ultraviolet Lithography System," filed May 29, 2012, which is incorporated herein by reference in its entirety.

BACKGROUND OF THE INVENTION

1. Field of the Invention

The present invention relates generally to equipment used in semiconductor processing. More particularly, the present invention relates to an extreme ultraviolet lithography system in which hoses which provide coolant to and from a heat exchanger are vibrationally isolated from the heat exchanger.

2. Description of the Related Art

Extreme ultraviolet (EUV) lithography is a semiconductor fabrication technology which enables semiconductors with small features, e.g., features with dimensions of approximately 45 nanometers (nm) or less, to be produced. In EUV lithography, a laser may heat xenon gas to create a plasma, although there are other methods used to make EUV plasmas. Electrons come off the plasma and radiate light. FIG. 1 is a block diagram representation of an EUV lithography system. An EUV lithography system 100 includes a vacuum chamber 128 which contains a source 104. Source 104 provides EUV light, and includes a plasma source 108 and a collector mirror 112 that reflects EUV light which come off of the plasma generated by plasma source 108 into an illuminator unit 116b of a body 116 of EUV lithography system 100. Illuminator unit 116b is a condenser that effectively collects light and directs or otherwise focuses the light onto a reticle 120. That is, illuminator unit 116b conditions light from plasma source 108 to improve uniformity. The light reflects off of reticle 120, through projection optics 116a of body 116, and onto a surface of a wafer 124.

Mirrors included in an EUV lithography system generally absorb some of light or radiation that enters the mirrors. Such mirrors (not shown) may be associated with illuminator unit 116b as well as with projection optics 116a. When light is absorbed by a mirror, the absorbed light is converted to heat. Heat generally causes distortion in the mirror, thereby degrading the optical performance of the mirror. When there is distortion in the mirror, the optical performance of the mirror is compromised.

The removal of heat from the mirrors is critical to ensure that an EUV lithography system performs with accuracy. When mirrors become heated, the mirrors may become distorted. The distortion of mirrors reduces the accuracy with which an EUV lithography system may perform. To prevent mirrors from becoming over heated, heat exchangers are often included in EUV lithography systems. In general, heat may be transferred from a mirror to a fluid associated with a heat exchanger. Cooled fluid is provided to the heat exchanger, and warmed fluid, i.e., the fluid into which heat is transferred from a mirror, is removed from the heat exchanger.

Hoses generally provide fluid, e.g., coolant, to a heat exchanger. Such hoses generally pass through a wall of a vacuum chamber. As leakage and outgassing associated with flexible hoses, e.g., rubber hoses, has an adverse effect on a vacuum environment associated with an EUV lithography system, stiff hoses, e.g., metal tubes, are often used to carry fluid to and from a heat exchanger. Stiff hoses, however, transmit vibrations associated with vacuum chamber walls to the heat exchanger and, hence, a mirror. Such vibrations may have an adverse effect on the overall performance of the EUV lithography system, particularly if the vibrations cause an illuminator unit, projection optics, a reticle, or a wafer to vibrate. By way of example, the accuracy of an EUV lithography process may be compromised when optics vibrate or are otherwise distorted.

While flexible hoses are less likely to carry vibrations associated with a wall of a vacuum chamber, flexible hoses have the adverse effect of outgassing and leaking. Stiff hoses generally do not outgas or leak, but may cause vibrations to be transferred to a mirror and other optical elements structurally connected to the mirror.

Therefore, what is needed is a method and a system which allows fluid to be provided to and carried from a heat exchanger that is arranged to provide cooling to a mirror of an EUV lithography system substantially without the adverse effects of outgassing, leakage, and the transfer of vibrations. That is, what is desired is a method and a system which provides vibration isolation such that vibrations of a vacuum chamber wall are not transferred to a mirror and other optical elements when stiff hoses are used to provide fluid to and from a heat exchanger.

SUMMARY OF THE INVENTION

The present invention pertains to vibrationally isolating hoses in an extreme ultraviolet (EUV) lithography system. The present invention may be implemented in numerous ways, including, but not limited to, as a method, system, device, or apparatus. Example embodiments of the present invention are discussed below.

According to one aspect of the present invention, an apparatus includes a first assembly, a vibration isolator, and a hose arrangement. The first assembly includes a heat exchanger and a mirror assembly. The vibration isolator is arranged to attenuate the vibrations when the vibrations are transmitted through the hose arrangement. The hose arrangement is coupled to the heat exchanger, and the vibration isolator is coupled to the hose arrangement.

According to another aspect of the present invention, a method for operating a lithography system includes identifying vibrations in at least one hose arranged to carry a coolant associated with a heat exchanger. The heat exchanger conducts heat away from a mirror assembly, and is coupled to a manifold through at least one tube. The tube carries the coolant between the hose and the heat exchanger. The method also includes driving the manifold to attenuate the vibrations in the hose. Driving the manifold causes the manifold to track a movement of the mirror assembly.

In accordance with yet another aspect of the present invention, an active vibration isolation system (AVIS) includes a manifold and an actuation system. The manifold is coupled to at least one hose that carries a coolant associated with a heat exchanger. The manifold is coupled to the heat exchanger, e.g., through at least one tube. The actuation system senses the vibrations, and drives the manifold to attenuate the vibrations.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, in which.

DETAILED DESCRIPTION OF THE EMBODIMENTS

Example embodiments of the present invention are discussed below with reference to the various figures. However, those skilled in the art will readily appreciate that the detailed description given herein with respect to these figures is for explanatory purposes, as the invention extends beyond these embodiments.

The performance of an extreme ultraviolet (EUV) lithography system may be compromised if vibrations are present within the system. For example, if vibrations from a vacuum chamber wall or a body of an EUV lithography system are transferred to a mirror and/or other optical elements which are structurally connected to the mirror, the performance of an EUV lithography system may be adversely affected. As such, vibrationally isolating any arrangement within an EUV lithography system that is likely to transfer vibrations to a mirror and/or other optical elements may attenuate such vibrations.

In one embodiment, relatively stiff hoses, e.g., metal hoses, which are used to circulate coolant to a heat exchanger coupled to a mirror assembly may be vibrationally isolated from the mirror assembly through an active vibration isolation system (AVIS). Such an AVIS may include a manifold which is arranged to track the movements of a mirror assembly, as well as an actuation system which is arranged to drive the manifold such that the manifold may effectively track the mirror assembly. The actuation system may be arranged to actuate the manifold in up to approximately six degrees of freedom. The AVIS attenuates vibrations transmitted through the hoses, and reduces the transfer of vibrations from a wall of a vacuum chamber to a mirror and/or other optical elements which are structurally connected to the mirror.

Figure 1:
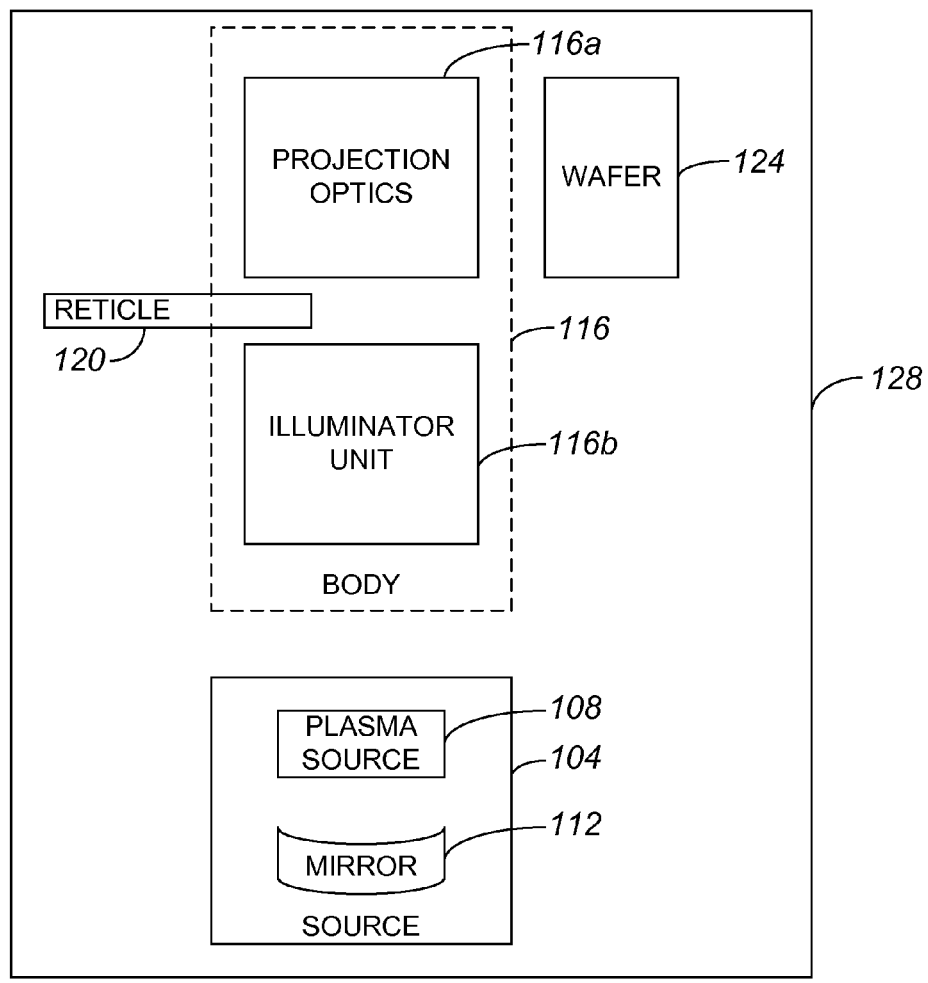
FIG. 1 is a block diagram representation of an extreme ultraviolet (EUV) lithography system.
Figure 2:
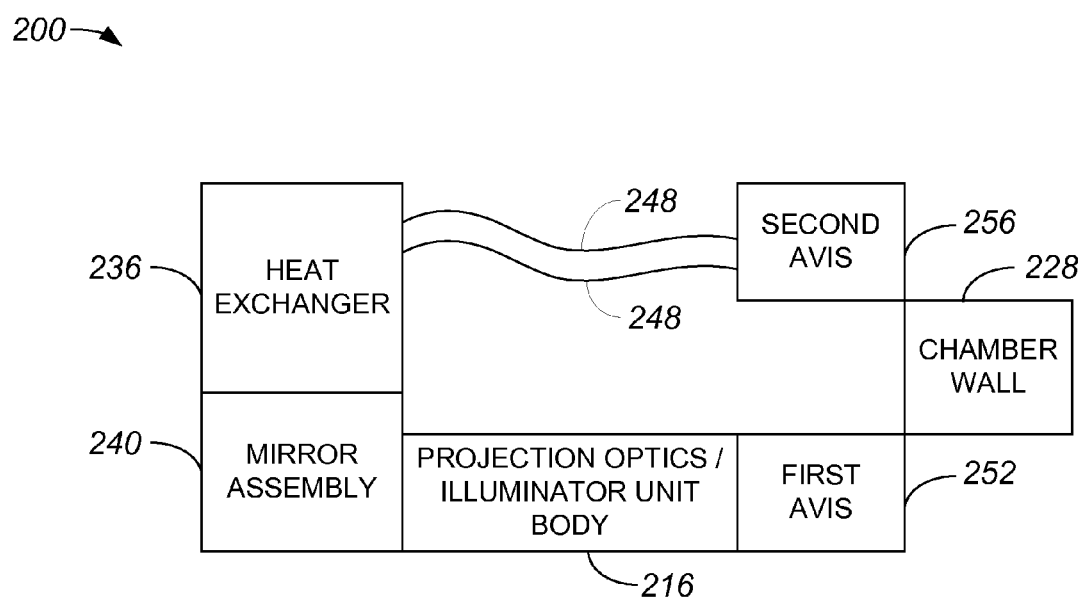
FIG. 2 is a block diagram representation of a portion of a EUV lithography system which includes an active vibration isolation system (AVIS) that is substantially directly coupled to hoses associated with a heat exchanger in accordance with an embodiment of the present invention.

With reference to FIG. 2, an EUV lithography system which includes an AVIS that is substantially directly coupled to hoses associated with a heat exchanger will be described in accordance with an embodiment of the present invention. A EUV lithography system 200 includes a vacuum chamber which has a chamber wall 228. Chamber wall 228 is generally coupled to a first active vibration isolation system (AVIS) 252 which is configured to isolate chamber wall 228 from external vibrations, e.g., ground vibrations.

EUV lithography system 200 also includes a projection optics/illuminator unit (PO/IU) body 216 which is generally present within a vacuum chamber, e.g., in a vacuum enclosed by chamber wall 228. PO/IU body 216 includes optical elements of EUV lithography system which are sensitive to vibrations. In one embodiment, PO/IU body 216 is coupled to first AVIS 252 such that first AVIS 252 may reduce the vibrations transmitted from, for example, a ground (not shown) to PO/IU body 216. That is, PO/IU body 216 is effectively isolated from vibrations in chamber wall 228 by first AVIS 252. First AVIS 252 may also reduce vibrations which originate from sources other than the ground (not shown).

A mirror assembly 240 is coupled to PO/IU body 216 within a vacuum enclosed by chamber wall 228. A heat exchanger 236 is coupled to mirror assembly 240 such that a relatively high heat load on mirror assembly 240 may be conducted to and, hence, substantially removed by heat exchanger 236. While a relatively high heat load on mirror assembly 240 may vary based upon the specifications of an overall system, in one embodiment, a heat absorption of approximately 3800 Watts (W) or more may be considered a relatively high heat load for a fly's eye mirror assembly. In the described embodiment, heat exchanger 236 is directly coupled to mirror assembly 240.

Coolant hoses 248 provide cooled fluid to heat exchanger 236, and also remove heated fluid from heat exchanger 236. A heat load from mirror assembly 240 is transferred to cooled fluid provided to heat exchanger 236 by coolant hoses 248, and carried away from mirror assembly 240 and heat exchanger 236 by coolant hoses 248. Coolant hoses 248 are coupled to chamber wall 228 through a second avis 256. Second AVIS 256 is arranged to attenuate vibrations, e.g., vibrations which originate, for example, at chamber wall 228, which are transmitted through coolant hoses 248 to heat exchanger 236 and mirror assembly 240. That is, second AVIS 256 reduces the amount of vibrations which are transmitted to mirror assembly 240 through coolant hoses 248. Second AVIS 256 may also reduce vibrations which originate from other than chamber wall 228.

Figure 3:
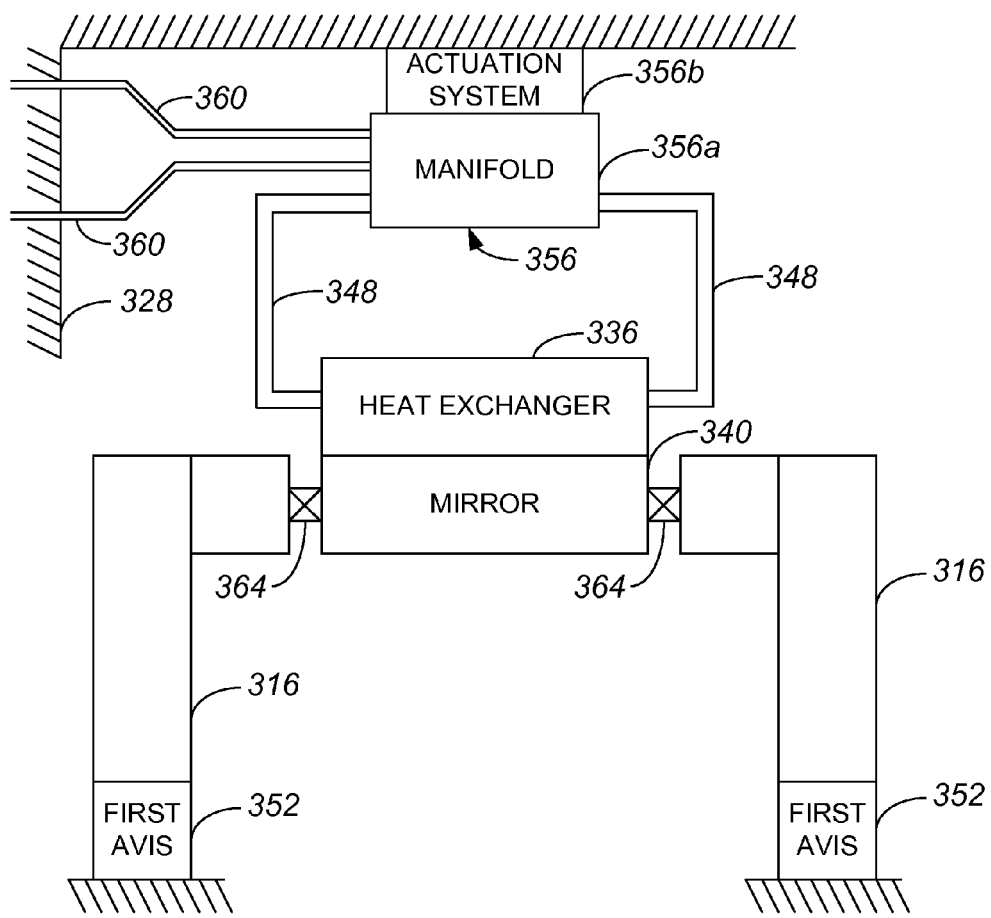
FIG. 3 is a diagrammatic cross-sectional representation of a EUV lithography system which includes an AVIS which attenuates vibrations that are transmitted through coolant hoses from a body and/or a chamber wall in accordance with an embodiment of the present invention.

Second AVIS 256 may include a manifold that is servoed in up to six degrees of freedom by an actuation system to follow or otherwise track the movement of mirror assembly 240. FIG. 3 is a diagrammatic cross-sectional representation of a EUV lithography system which includes an AVIS that has a manifold and an actuation system which attenuate vibrations that are transmitted through coolant hoses from a body and/or a chamber wall in accordance with an embodiment of the present invention. An EUV lithography system 300 includes a lens barrel 316 which is supported by a vibration isolator 352. In the described embodiment, vibration isolator 352 is a first AVIS 352. Vibration isolator 352 may provide active vibration control using actuators such as voice coil motors. Lens barrel 316 is arranged to contain optical elements of EUV lithography system 300, such as a mirror 340. Mirror 340 is coupled to, or supported on, lens barrel 316 through a mirror mount 364.

A heat exchanger 336 is coupled to mirror 340 such that heat may be conducted from mirror 340 to heat exchanger 336. In one embodiment, heat exchanger 336 is integrally coupled to mirror 340, which includes a reflective surface. Tubes 348 which carry coolant to and from heat exchanger 336 are coupled to a second AVIS 356. Tubes 348 are typically relatively stiff, and may be formed from a material such as metal. Second AVIS 356 is coupled to a chamber wall 328 or, more generally, a body associated with EUV lithography system 300. Hoses 360 carry coolant to and from second AVIS 356 such that the coolant may be delivered to, and received from, heat exchanger 336 through tubes 348. Hoses 360 are arranged to pass through chamber wall 328.

Second AVIS 356 generally includes a manifold 356a and an actuation system 356b which is configured to drive manifold 356a such that manifold 356a and, hence, tubes 348, may effectively track the movement of mirror 340. Actuation system 356b is arranged to reject disturbances transmitted from chamber wall 328 or a body or EUV lithography system 300. Such disturbances include, but are not limited to including, ground disturbances which cause chamber wall 328 to vibrate. Actuation system 356b is generally kinematically mounted to chamber wall 328. In general, actuation system 356b may be arranged to drive manifold 356a in any number of degrees of freedom. By way of example, actuation system 356b may be arranged to drive manifold 356a in up to approximately six degrees of freedom. It should be appreciated, however, that actuation system 356b may instead be arranged to drive manifold 356a up to approximately five degrees of freedom or up to approximately three degrees of freedom.

When actuation system 356b servos manifold 356a, hoses 360 may bend slightly to accommodate the movement of manifold 356a. As such, actuation system 356b has at least enough force to cause hoses 360 to bend. In one embodiment, hoses 360 may be formed from metal that is partially bent when in a default state, i.e., when actuation system is not driving manifold 356a.

Figure 4:
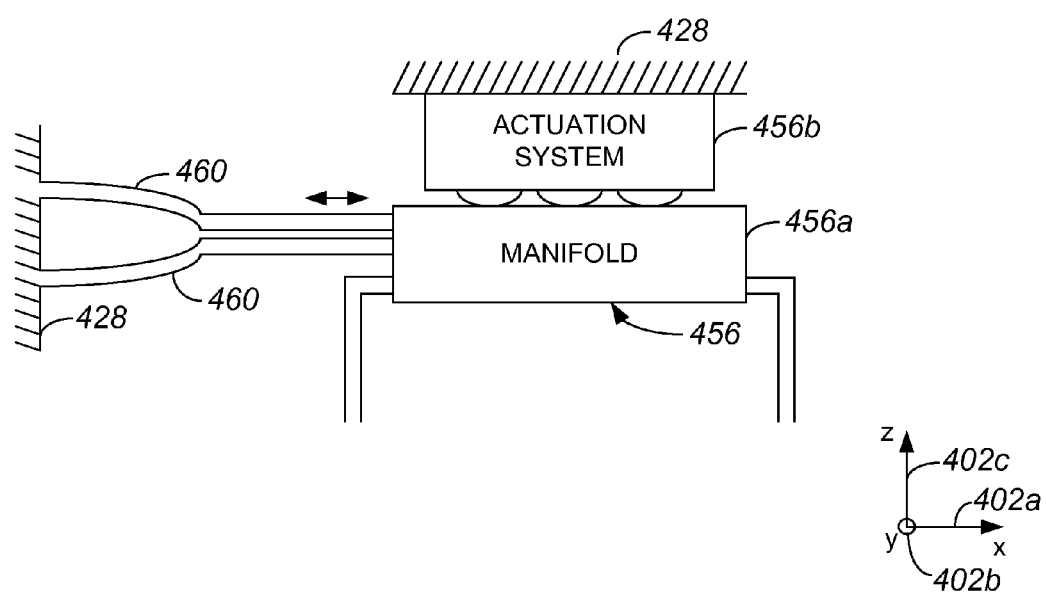
FIG. 4 is a diagrammatic representation of an AVIS which attenuates vibrations that are transmitted through coolant hoses from a body and/or a chamber wall in accordance with an embodiment of the present invention.

Referring next to FIG. 4, an AVIS which attenuates vibrations that are transmitted through coolant hoses from a body and/or a chamber wall will be described in more detail in accordance with an embodiment of the present invention. An AVIS 456 is arranged such that when an actuation system 456b, which is coupled to a body or a chamber wall 428 drives a manifold 456a in an x-direction 402a, hoses 460 which carry coolant to and from manifold 456a may bend or straighten out as appropriate. Actuation system 456b may generally drive manifold 456a to follow a mirror (not shown) in up to approximately six degrees of freedom such that disturbances transmitted through body or chamber wall 428 do not have a significant effect on the mirror. The six degrees of freedom may be translation in x-direction 402a, rotation about x-direction 402a, translation in a y-direction 402b, rotation about y-direction 402b, translation in a z-direction 402c, and rotation about z-direction 402c.

Actuation system 456b may include any suitable actuator which is capable of servoing or otherwise driving manifold 456a in a desired number of degrees of freedom. By way of example, actuation system 456b may include at least one voice coil motor.

In general, actuation system 456b includes sensors (not shown) which allow actuation system 456b to determine how much force to apply to drive manifold 456a, and the direction in which manifold 456a is to be driven. Sensors (not shown) associated with actuation system 456b may include inertial sensors which are configured to determine how much force is needed to bend hoses 460, as well as sensors which may be used to determine the location of a mirror (not shown). Sensors (not shown) used to determine the location of a mirror may be positioned substantially between manifold 456a and a mirror (not shown).

Figure 5:
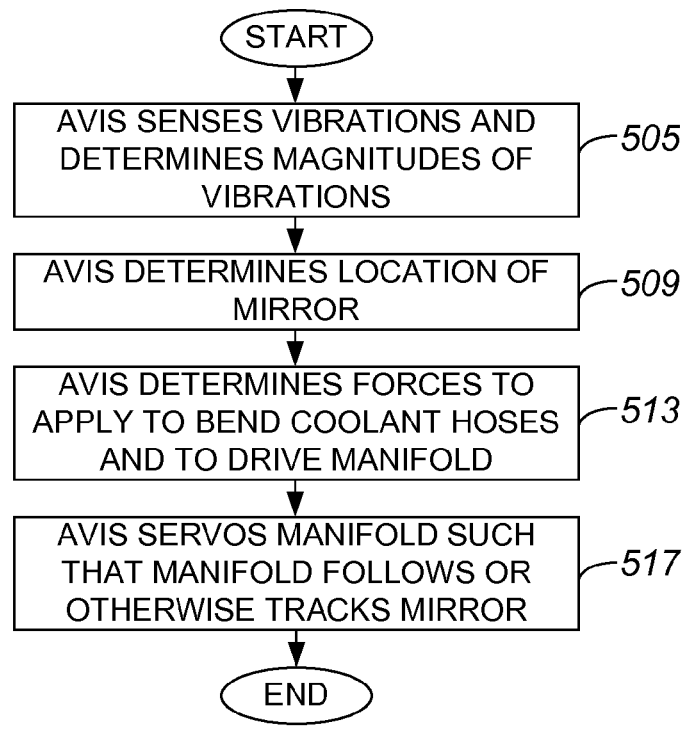
FIG. 5 is a process flow diagram which illustrates a method of operating an AVIS which attenuates vibrations transmitted through coolant hoses in accordance with an embodiment of the present invention.

FIG. 5 is a process flow diagram which illustrates a method of operating an AVIS which attenuates vibrations transmitted through coolant hoses associated with a EUV lithography system in accordance with an embodiment of the present invention. A method 501 of operating an AVIS which attenuates vibrations transmitted through coolant hoses begins at step 505 in which the AVIS senses vibrations transmitted through coolant hoses and determines the magnitudes of the vibrations.

Once the AVIS senses vibrations, the AVIS determines the location of a mirror to be tracked in step 509. The AVIS may determine the location of the mirror using sensors positioned between the AVIS or, more specifically, a manifold of the AVIS, and the mirror. In step 513, the AVIS determines the magnitude of forces needed to bend the coolant hoses and, hence, to drive the manifold. As previously mentioned, sensors including inertial sensors may be used to determine forces needed to bend the coolant hoses.

After the AVIS determines the forces appropriate to bend the coolant hoses and to drive the manifold, process flow proceeds to step 517 in which the AVIS servos, or otherwise drives, the manifold such that the manifold follows or otherwise tracks the mirror. It should be appreciated that when the AVIS or, mores specifically, an actuation system of the AVIS, servos the manifold, the coolant hoses typically also bend or straighten, as appropriate. The process of operating an AVIS is completed once the AVIS servos the manifold.

Figure 6A:
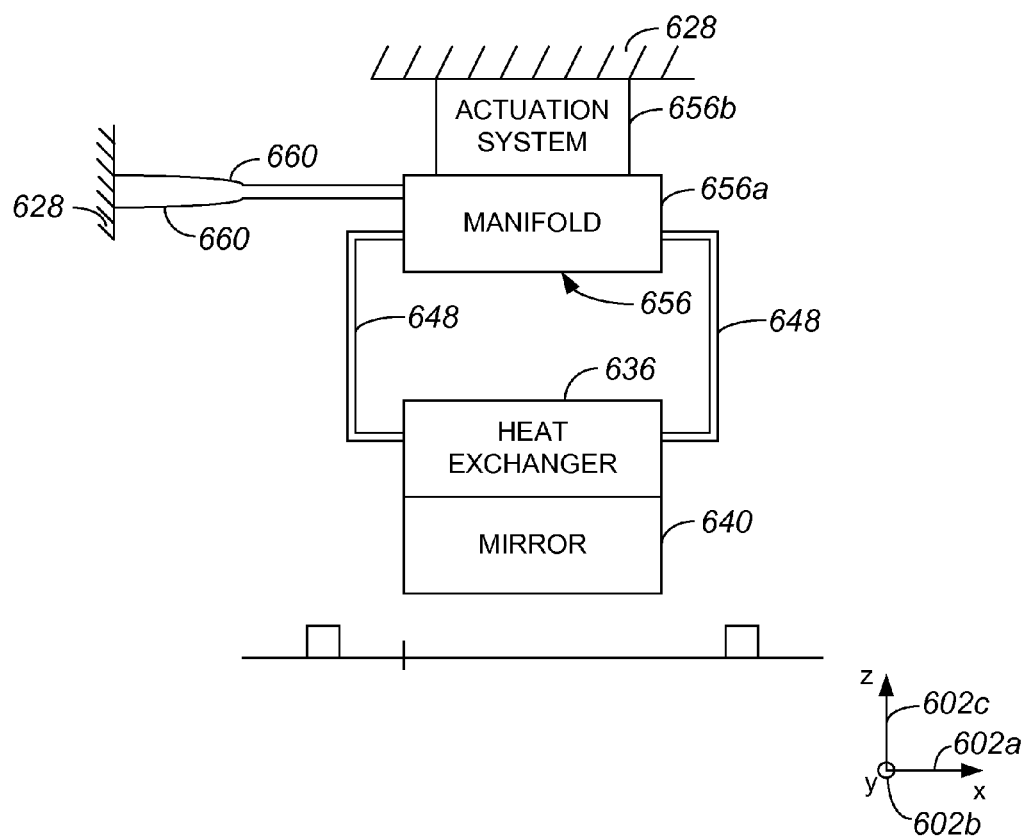
FIG. 6A is a diagrammatic representation of a manifold positioned with respect to an actuation system at a time t1 in accordance with an embodiment of the present invention.
Figure 6B:
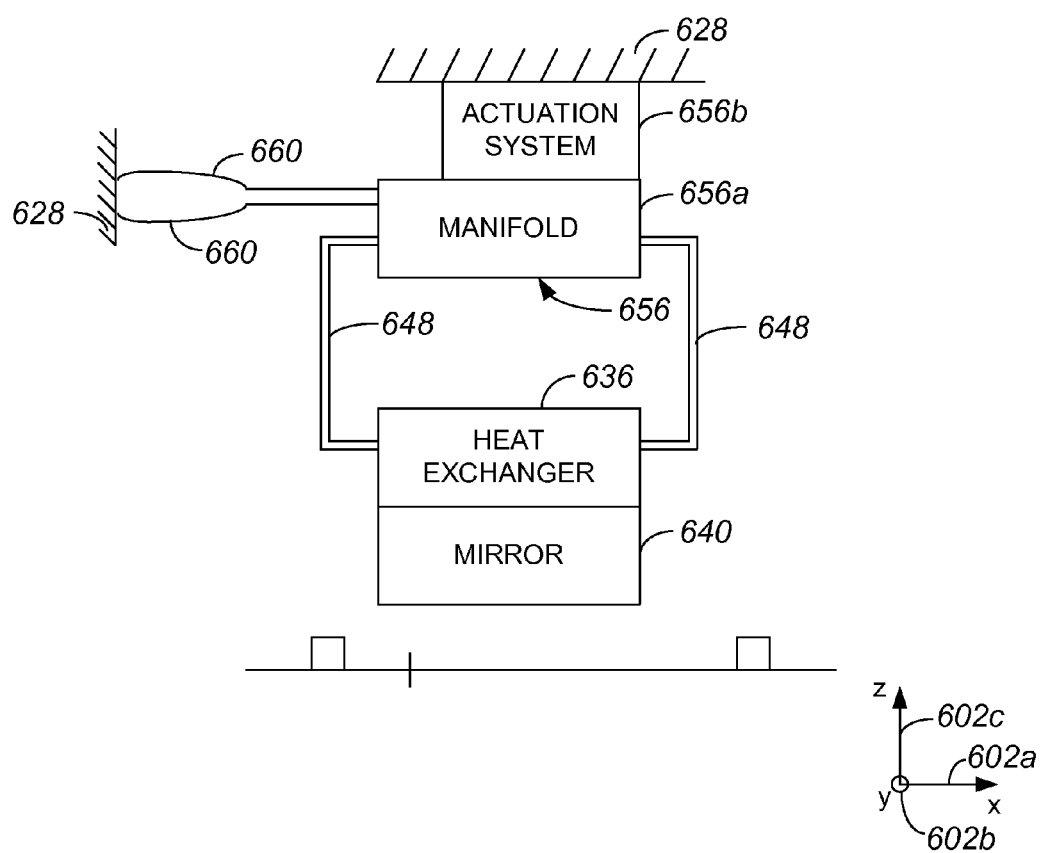
FIG. 6B is a diagrammatic representation of a manifold positioned with respect to an actuation system, e.g., manifold 656a and actuation system 656b of FIG. 6A, at a time t2 in accordance with an embodiment of the present invention.

When a manifold is servoed or otherwise driven, the manifold moves with respect to an associated actuation system. With reference to FIGS. 6A and 6B, the movement of a manifold will be described. FIG. 6A is a diagrammatic representation of a manifold positioned with respect to an actuation system at a time t1 in accordance with an embodiment of the present invention. FIG. 6B is a diagrammatic representation of a manifold positioned with respect to an actuation system, e.g., manifold 656a and actuation system 656b of FIG. 6A, at a time t2 in accordance with an embodiment of the present invention. At a time t1, as shown in FIG. 6A, an AVIS 656, which includes a manifold 656a and an actuation system 656b, is in a substantially default state. That is, AVIS 656 is positioned such that hoses 660 which provide coolant to and remove coolant from manifold 656a, tubes 648, and a heat exchanger 636 are in a "rest" state.

Actuation system 656b is generally kinematically mounted to chamber wall 628. Actuation system 656b is arranged to drive manifold 656a to follow the movement of mirror 640. When manifold 656a moves to track movement of mirror 640, tubes 648, e.g., metal tubes, are also moved to substantially track the movement of mirror 640.

In the described embodiment, manifold 656a may be driven along and about axes 602a-c. As such, manifold 656a may have up to approximately six degrees of freedom. As shown in FIG. 6B, at a time t2, actuation system 656b has driven manifold 656a along x-axis 602a. For purposes of illustration, the movement of manifold 656a has been exaggerated. While actuation system 656b remains substantially fixed with respect to chamber wall 628, manifold 656a has moved with respect to actuation system 656b such that manifold 656a and, hence, tubes 648 track mirror 640 which has translated relative to x-axis 602a.

Hoses 660 are more bent at time t2 than at time t1 because of the movement of manifold 656a. It should be appreciated that hoses 660 may be straightened out or bent in response to the movement of manifold 656a, depending upon the direction in which or about which manifold 656a moves.

Figure 7:
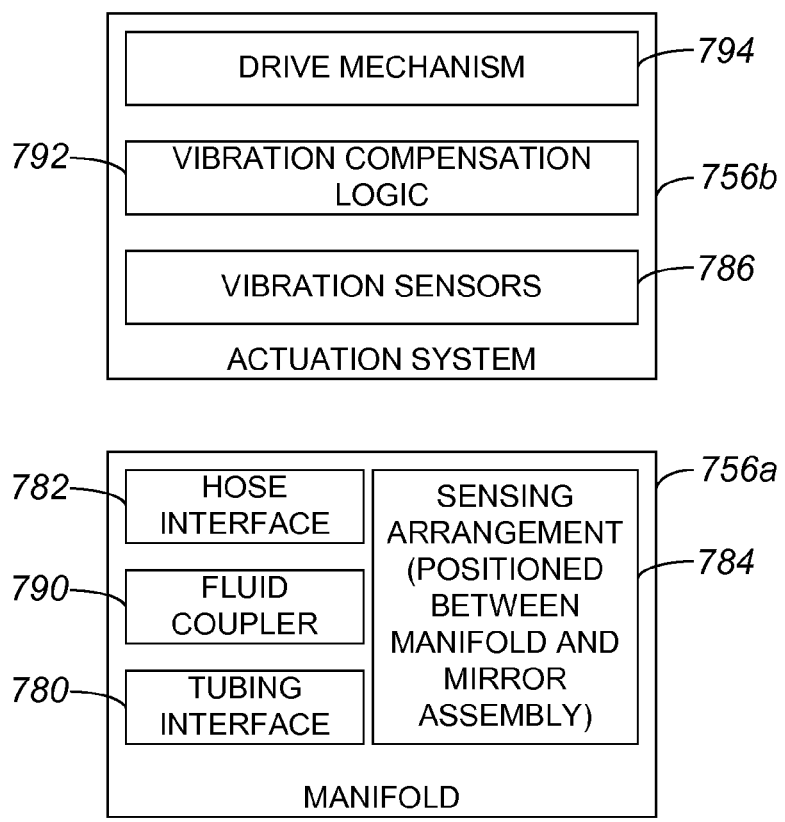
FIG. 7 is a block diagram representation of an AVIS in accordance with an embodiment of the present invention.

As previously mentioned, an AVIS which is configured to attenuate vibrations transmitted through coolant hoses may include sensors in addition to an actuation system and a manifold. FIG. 7 is a block diagram representation of one AVIS which is configured to attenuate vibrations transmitted through coolant hoses in accordance with an embodiment of the present invention. An AVIS 756 includes a manifold 756a and an actuation system 756b. Manifold 756a includes a tubing interface 780 which couples manifold 756a to tubes (not shown) that carry coolant to and from a heat exchanger (not shown). Manifold 756a also includes a hose interface 782 which couples hoses (not shown), i.e., hoses which carry coolant to and from a source outside of a vacuum chamber, to manifold 756a. A fluid coupler 790 is arranged to substantially connect hose interface 782 to tubing interface 780 such that a coolant may flow from hoses (not shown) to tubes (not shown). In one embodiment, in lieu of having separate hoses and separate tubing, a substantially single hose may effectively replace a hose and a tube. Manifold 756a also includes a sensing arrangement 784 which includes at least one sensor that is configured to determine a location of a mirror (not shown) that manifold 756a is to track. Such sensors are typically positioned between manifold 756a and the mirror (not shown). Sensing arrangement 784 also may include logic that processes signals received from sensors, although such logic may instead be included in actuation system 756b.

Actuation system 756b includes a drive mechanism 794 which is arranged to drive manifold 756a. Drive mechanism 794 generally includes at least one actuator or motor. Drive mechanism 794 may be arranged to drive manifold 756a in up to approximately six degrees of freedom, although it should be appreciated that drive mechanism 794 may be arranged to drive manifold 756a in any number of degrees of freedom. By way of example, drive mechanism 794 may be arrange to drive manifold in up to approximately three degrees of freedom or up to approximately five degrees of freedom if there is no need for a particular AVIS 756 to support approximately six degrees of freedom.

Actuation system 756b also includes vibration sensors 786 that are configured to sense vibrations transmitted through hoses (not shown). Signals obtained from vibration sensors 786 are processed by vibration compensation logic 792 to determine the amount of force needed to drive manifold 756a to substantially compensate for the sensed vibrations. In other words, signals from vibration sensors 786 may be used by vibration compensation logic 792 to substantially control drive mechanism 794. Controlling drive mechanism 794 may include, but is not limited to including, determining an amount by which manifold 756a is to be driven, as well as a direction in which manifold 756a is to be driven.

A heat exchanger and a mirror may be coupled to form a moveable assembly, or an assembly that may be moved from a main chamber of an overall vacuum chamber to a load lock of the overall vacuum chamber arrangement. By allowing a mirror to be moved with a heat exchanger, e.g., by allowing a mirror to be substantially permanently connected to a heat exchanger, issues associated with disconnecting the mirror from the heat exchanger may be avoided.

Figure 10A:
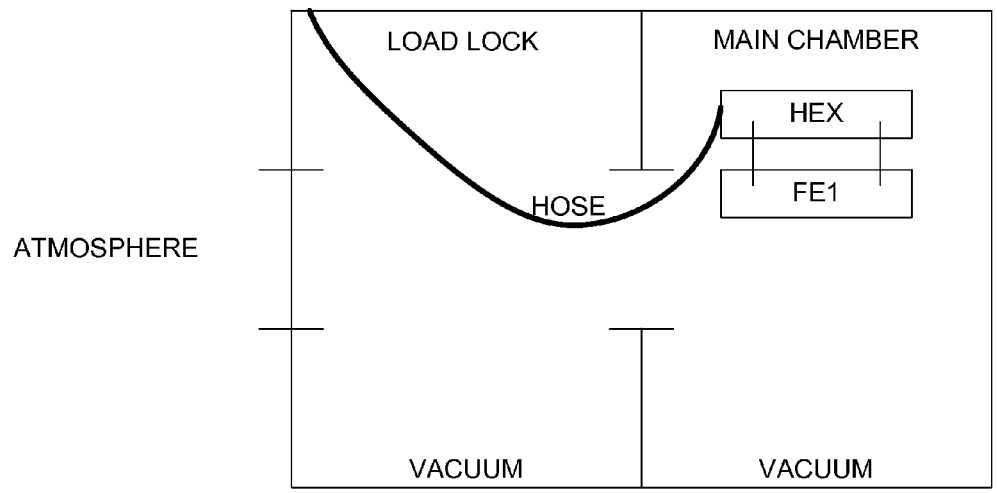
FIG. 10A is a diagrammatic representation of a heat exchanger and a mirror that cooperate to form a moveable assembly in which the assembly is positioned within a main chamber of a vacuum chamber in accordance with an embodiment of the present invention.
Figure 10B:
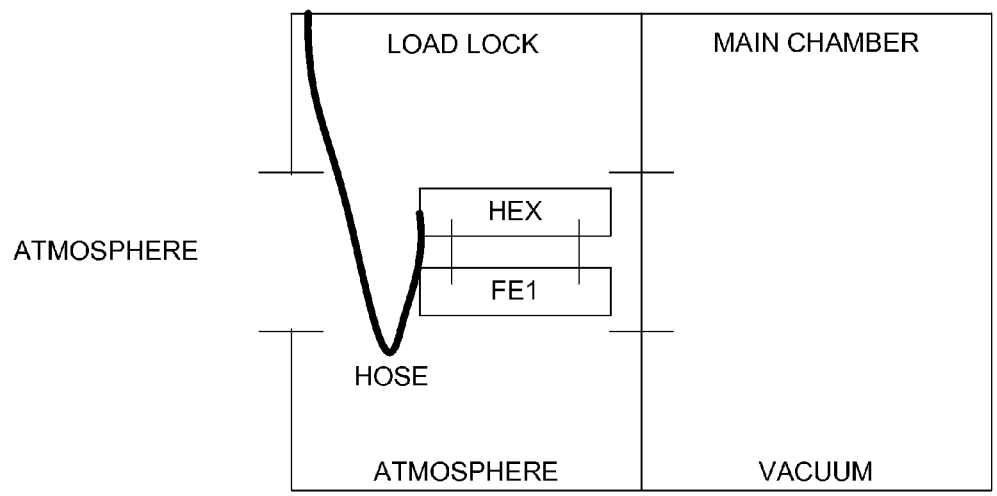
FIG. 10B is a diagrammatic representation of a heat exchanger and a mirror that cooperate to form a moveable assembly in which the assembly is positioned within a load lock chamber of a vacuum chamber in accordance with an embodiment of the present invention.

FIG. 10A is. diagrammatic representation of a heat exchanger and a mirror that cooperate to form a moveable assembly in which the assembly is positioned within a main chamber of a vacuum chamber arrangement in accordance with an embodiment of the present invention. During normal operation, a load lock and a main chamber of a vacuum chamber arrangement may both be in vacuum. When a mirror, e.g., FE1, is to be removed from a vacuum chamber arrangement for maintenance purposes, the moveable assembly that includes the mirror and a heat exchanger, e.g., HEX, may be moved into the load lock, as shown in FIG. 10B. That is, the mirror may be brought into the load lock with the heat exchanger. The load lock may be sealed from the main chamber, and opened to the atmosphere once the moveable assembly is moved into the load lock.

Figure 11A:
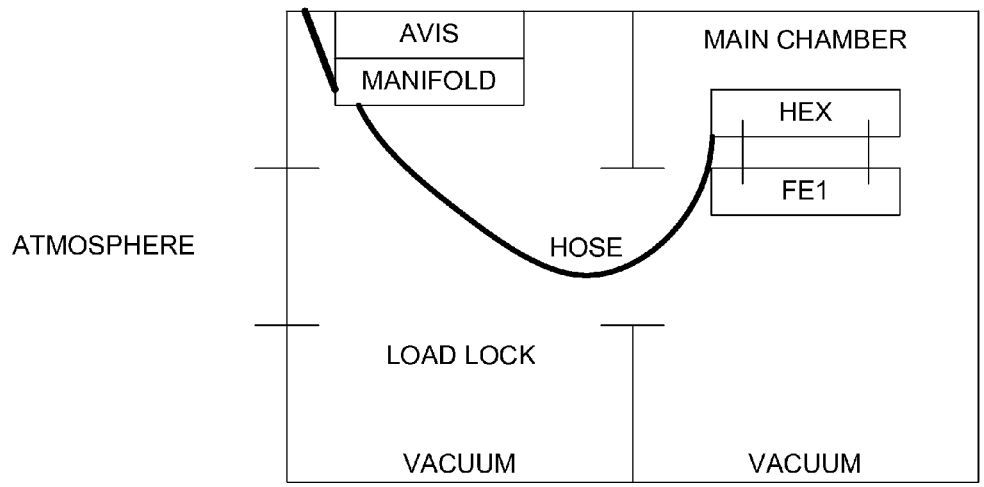
FIG. 11A is a diagrammatic representation of a heat exchanger and a mirror that cooperate to form a moveable assembly in which the assembly is positioned within a main chamber of a vacuum chamber and coupled by a hose to an AVIS system in accordance with an embodiment of the present invention.
Figure 11B:
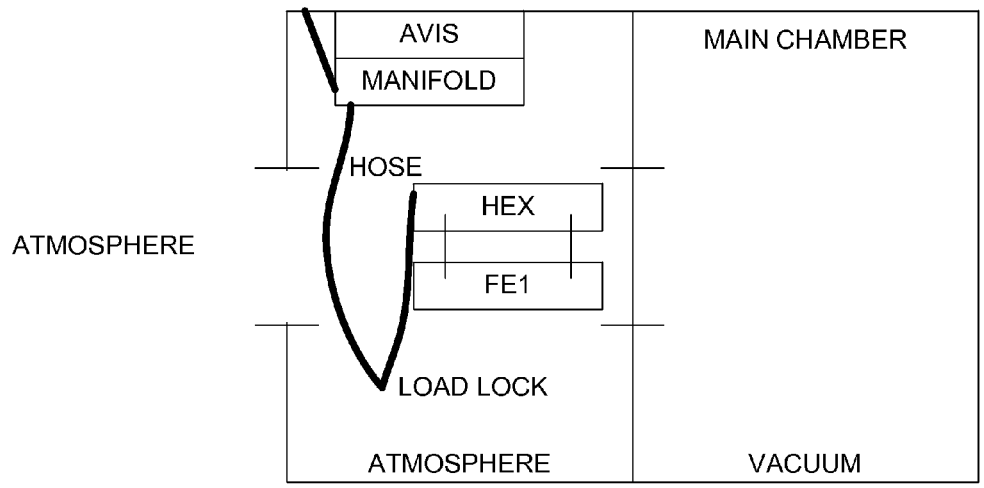
FIG. 11B is a diagrammatic representation of a heat exchanger and a mirror that cooperate to form a moveable assembly in which the assembly is positioned within a load lock chamber of a vacuum chamber and coupled by a hose to an AVIS system in accordance with an embodiment of the present invention.

FIG. 11A is a diagrammatic representation of a heat exchanger and a mirror that cooperate to form a moveable assembly in which the assembly is positioned within a main chamber of a vacuum chamber and coupled by a hose to an AVIS system in accordance with an embodiment of the present invention. During normal or standard operation, a load lock and a main chamber of a vacuum chamber arrangement may both be in vacuum, while a hose connects a moveable assembly that includes a mirror and a heat exchanger to an AVIS system that includes a manifold. When a mirror, e.g., FE1, is to be removed from a vacuum chamber arrangement for maintenance purposes, the moveable assembly that includes the mirror and a heat exchanger, e.g., HEX, may be moved into the load lock, as shown in FIG. 11B. That is, the mirror may be brought into the load lock with the heat exchanger. The load lock may be sealed from the main chamber, and opened to the atmosphere once the moveable assembly is moved into the load lock.

A EUV lithography system according to the above-described embodiments, e.g., a lithography apparatus which may include an AVIS arranged to attenuate vibrations transmitted through cooling hoses, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 8:
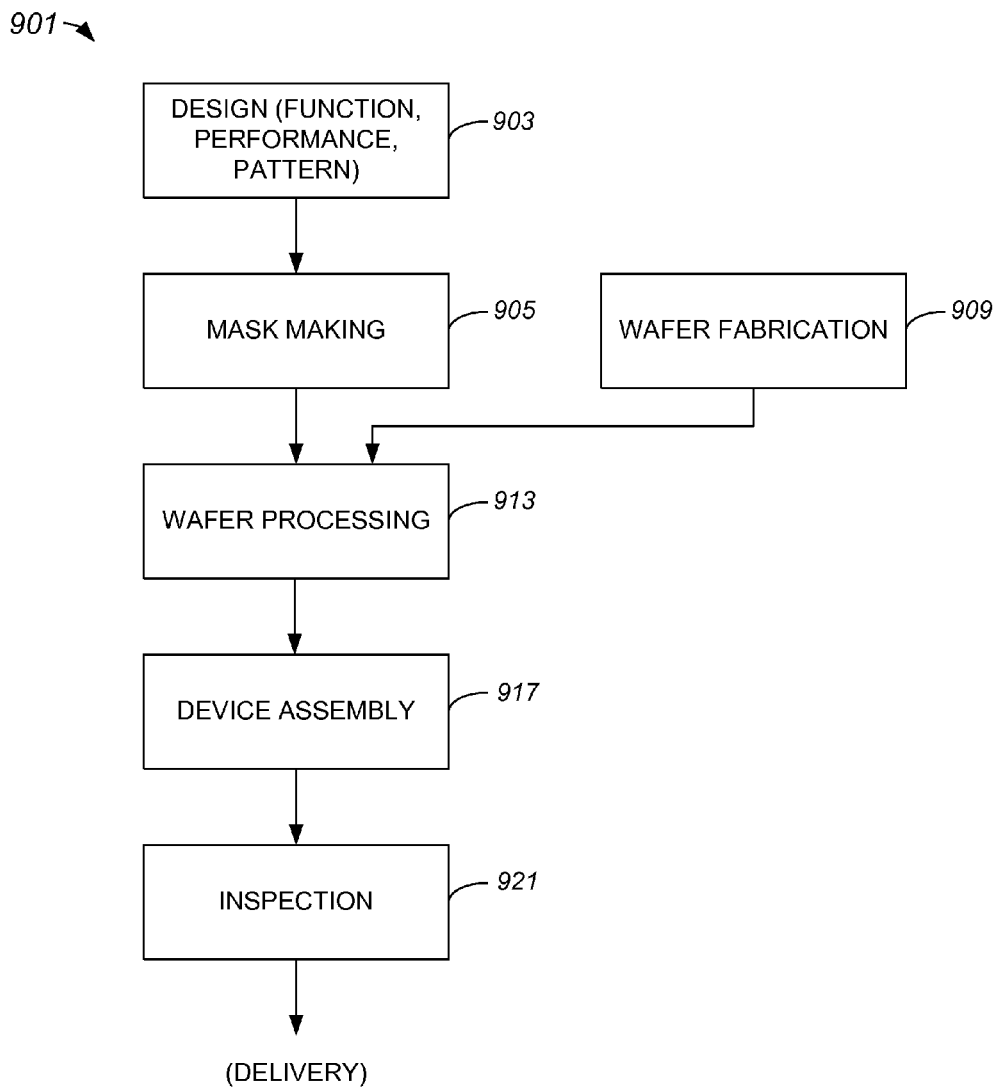
FIG. 8 is a process flow diagram which illustrates the steps associated with fabricating a semiconductor device in accordance with an embodiment of the present invention.

Further, semiconductor devices may be fabricated using systems described above, as will be discussed with reference to FIG. 8. FIG. 8 is a process flow diagram which illustrates the steps associated with fabricating a semiconductor device in accordance with an embodiment of the present invention. A process 901 of fabricating a semiconductor device begins at step 903 in which the function and performance characteristics of a semiconductor device are designed or otherwise determined. Next, in step 905, a reticle or mask in which has a pattern is designed based upon the design of the semiconductor device. It should be appreciated that in a substantially parallel step 909, a wafer is typically made from a silicon material. In step 913, the mask pattern designed in step 905 is exposed onto the wafer fabricated in step 909 through the use of an EUV lithography system. One process of exposing a mask pattern onto a wafer will be described below with respect to FIG. 9. In step 917, the semiconductor device is assembled. The assembly of the semiconductor device generally includes, but is not limited to including, wafer dicing processes, bonding processes, and packaging processes. Finally, the completed device is inspected in step 921. Upon successful completion of the inspection in step 921, the completed device may be considered to be ready for delivery.

Figure 9:
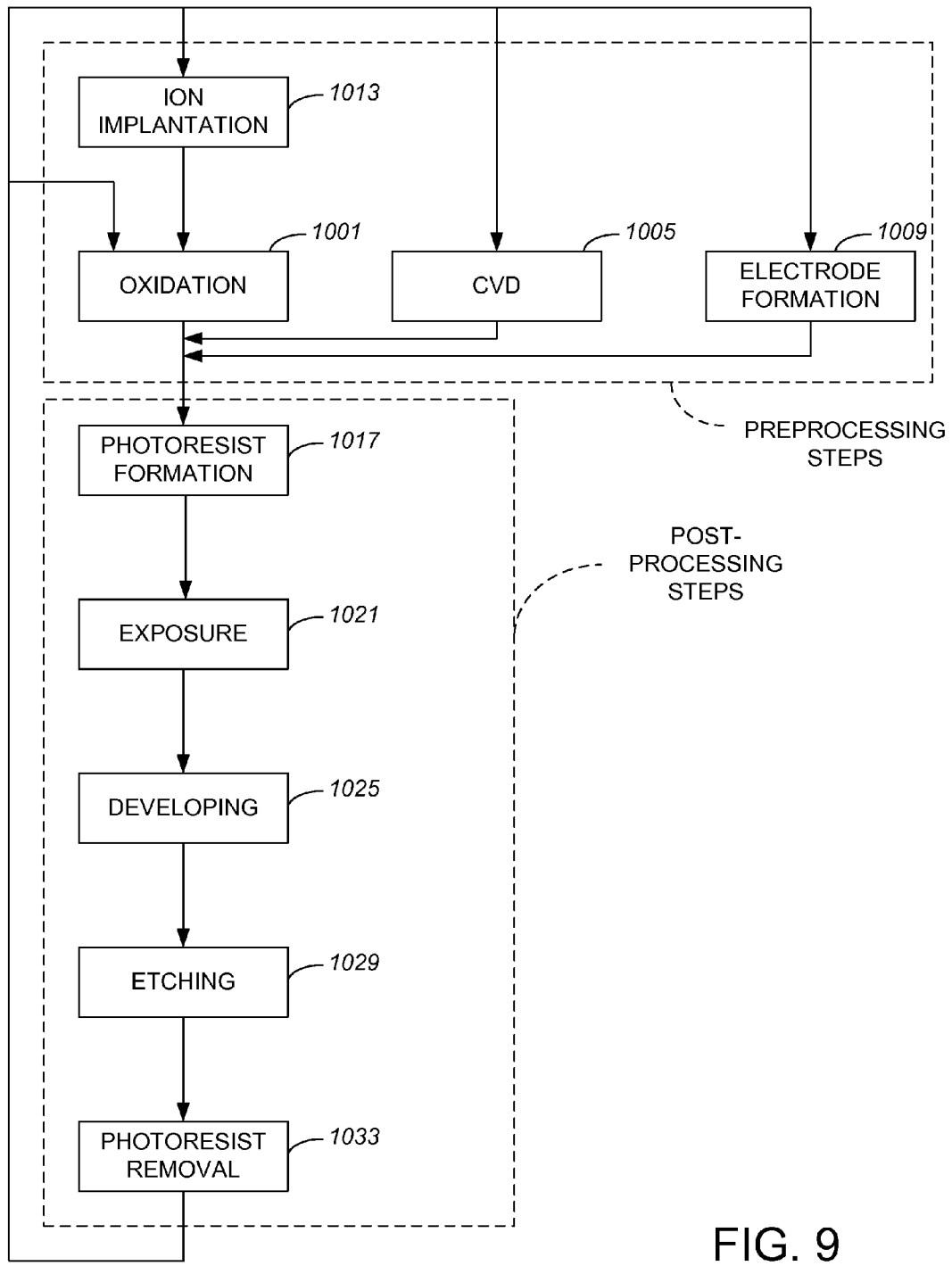
FIG. 9 is a process flow diagram which illustrates the steps associated with processing a wafer, i.e., step 913 of FIG. 8, in accordance with an embodiment of the present invention.

FIG. 9 is a process flow diagram which illustrates the steps associated with wafer processing in the case of fabricating semiconductor devices in accordance with an embodiment of the present invention. In step 1001, the surface of a wafer is oxidized. Then, in step 1005 which is a chemical vapor deposition (CVD) step in one embodiment, an insulation film may be formed on the wafer surface. Once the insulation film is formed, then in step 1009, electrodes are formed on the wafer by vapor deposition. Then, ions may be implanted in the wafer using substantially any suitable method in step 1013. As will be appreciated by those skilled in the art, steps 1001-1013 are generally considered to be preprocessing steps for wafers during wafer processing. Further, it should be understood that selections made in each step, e.g., the concentration of various chemicals to use in forming an insulation film in step 1005, may be made based upon processing requirements.

At each stage of wafer processing, when preprocessing steps have been completed, post-processing steps may be implemented. During post-processing, initially, in step 1017, photoresist is applied to a wafer. Then, in step 1021, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 1025. Once the exposed wafer is developed, parts other than residual photoresist, e.g., the exposed material surface, may be removed by etching in step 1029. Finally, in step 1033, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, an AVIS which is arranged to attenuate vibrations transmitted through coolant hoses has been described as including a manifold and an actuation system. However, such an AVIS is not limited to including a manifold and an actuation system. Substantially any suitable AVIS which attenuates vibrations transmitted through coolant hoses may be used with an EUV lithography system of the present invention.

While coolant hoses and tubes have been described as being formed from metal, coolant hoses and tubes are not limited to being formed from metal. In general, coolant hoses and tubes may be formed from substantially any suitable relatively stiff material which does not significantly outgas.

The operations associated with the various methods of the present invention may vary widely. By way of example, steps may be added, removed, altered, combined, and reordered without departing from the spirit or the scope of the present invention.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. An apparatus comprising:
   a first assembly, the first assembly including a heat exchanger and a mirror assembly;
   a vibration isolator; and
   a hose arrangement, the hose arrangement being coupled to the heat exchanger, wherein the vibration isolator is coupled to the hose arrangement and arranged to sense a vibration transmitted through the hose arrangement, the vibration isolator being configured to actively attenuate the vibration in response to movement of the hose arrangement.

2. The apparatus of claim 1 wherein the hose arrangement includes at least one coolant hose and at least one tube, wherein the at least one coolant hose is coupled to the vibration isolator and a structure which is subject to vibrations and wherein the at least one tube is coupled to the vibration isolator and the heat exchanger.

3. The apparatus of claim 2 wherein the vibration isolator includes an actuation system and a manifold, the actuation system being arranged to drive the manifold to track the mirror assembly.

4. The apparatus of claim 3 wherein the vibration isolator is arranged to sense the vibration and to drive the manifold to track the mirror assembly to compensate for the vibrations.

5. The apparatus of claim 3 wherein the at least one coolant hose and the at least one tube are coupled to the manifold.

6. The apparatus of claim 3 wherein the actuation system is configured to drive the manifold in up to approximately six degrees of freedom.

7. The apparatus of claim 3 further comprising:
a structure, the structure being subject to vibrations, wherein the actuation system is kinematically mounted to the structure.

8. The apparatus of claim 7 wherein the structure is a wall of a vacuum chamber or a body associated with the vacuum chamber.

9. The apparatus of claim 2 wherein the hose arrangement is arranged to carry a coolant to the heat exchanger and to remove the coolant from the heat exchanger.

10. The apparatus of claim 1 wherein the heat exchanger is coupled to the mirror assembly such that when the mirror assembly is moved from a vacuum chamber arrangement to a load lock, the heat exchanger is moved with the mirror assembly.

11. The apparatus of claim 1 wherein the apparatus is an extreme ultraviolet lithography system.

12. A device manufactured with the EUV lithography system of claim 11.

13. A method for operating a lithography system, the method comprising:
identifying a vibration in at least one hose arranged to carry a coolant associated with a heat exchanger, the heat exchanger being arranged to conduct heat away from a mirror assembly, the heat exchanger being coupled to a manifold through at least one tube, the at least one tube being arranged to carry the coolant between the at least one hose and the heat exchanger; and
driving the manifold to attenuate the vibration in the at least one hose, wherein driving the manifold causes the manifold to track a movement of the mirror assembly, and wherein driving the manifold to attenuate the vibration in the at least one hose includes driving the manifold to actively attenuate the vibration in response to movement of the at least one hose.

14. The method of claim 13 wherein driving the manifold includes driving the manifold using an actuation system, the manifold and the actuation system being included in a vibration isolation system.

15. The method of claim 13 further including determining an amount by which to drive the manifold to attenuate the vibration, wherein driving the manifold includes driving the manifold by the amount.

16. The method of claim 13 wherein driving the manifold to attenuate the vibration in the at least one hose includes causing the at least one hose to bend.

17. The method of claim 13 wherein the lithography system is an extreme ultraviolet lithography system.

18. The method of claim 17 further including forming a device using the extreme ultraviolet lithography system.

19. A vibration isolation system arranged to attenuate a vibration, the vibration isolation system comprising:
a manifold, the manifold being coupled to at least one hose arranged to carry a coolant associated with a heat exchanger, the manifold further being coupled to the heat exchanger; and
an actuation system, the actuation system being arranged to sense the vibration, wherein the actuation system is further arranged to drive the manifold to actively attenuate the vibration in response to movement of the at least one hose.

20. The vibration isolation system of claim 19 wherein the heat exchanger is arranged to remove a heat load from a mirror, and wherein the actuation system is arranged to drive the manifold to attenuate the vibration by driving the manifold to track a movement of the mirror.

21. The vibration isolation system of claim 20 wherein the mirror is coupled to the heat exchanger.

22. The vibration isolation system of claim 20 wherein the actuation system is arranged to drive the manifold in up to approximately six degrees of freedom.

23. The vibration isolation system of claim 20 wherein the manifold is coupled to the heat exchanger through at least one tube, the tube being arranged to carry the coolant between the at least one hose and the heat exchanger.

24. The vibration isolation system of claim 19 wherein the actuation system is kinematically coupled to a wall of a vacuum chamber of an extreme ultraviolet lithography system.

25. The vibration isolation system of claim 24 wherein the at least one hose is coupled to the wall.

* * * * *